United States Patent
Park et al.

(10) Patent No.: US 11,011,673 B2
(45) Date of Patent: May 18, 2021

(54) QUANTUM DOT DEVICE AND DISPLAY DEVICE

(71) Applicant: SAMSUNG ELECTRONICS CO., LTD., Suwon-si (KR)

(72) Inventors: Kun Su Park, Seongnam-si (KR); Tae Ho Kim, Seongnam-si (KR); Sung Woo Kim, Hwaseong-si (KR); Chan Su Kim, Seoul (KR); Tae Hyung Kim, Seoul (KR); Eun Joo Jang, Suwon-si (KR)

(73) Assignee: SAMSUNG ELECTRONICS CO., LTD., Gyeonggi-do (KR)

(*) Notice: Subject to any disclaimer, the term of this patent is extended or adjusted under 35 U.S.C. 154(b) by 0 days.

(21) Appl. No.: 16/442,926

(22) Filed: Jun. 17, 2019

(65) Prior Publication Data
US 2020/0035857 A1 Jan. 30, 2020

(30) Foreign Application Priority Data
Jul. 24, 2018 (KR) .................. 10-2018-0086209

(51) Int. Cl.
*H01L 33/06* (2010.01)
*H01L 33/00* (2010.01)
*H01L 33/28* (2010.01)

(52) U.S. Cl.
CPC .......... *H01L 33/06* (2013.01); *H01L 33/0029* (2013.01); *H01L 33/0083* (2013.01); *H01L 33/28* (2013.01)

(58) Field of Classification Search
CPC ............... H01L 51/0037; H01L 51/502; H01L 51/0039; H01L 33/06; H01L 33/0029;
(Continued)

(56) References Cited

U.S. PATENT DOCUMENTS 8,241,531 B2 8/2012 Yu et al.
2009/0072725 A1* 3/2009 Suzuki ................ H01L 51/0031
313/504
(Continued)

FOREIGN PATENT DOCUMENTS

CN 205564819 U 9/2016
JP 2004292873 A 10/2004
(Continued)

OTHER PUBLICATIONS

Extended European Search Report dated Oct. 10, 2019, of the corresponding European Patent Application No. 19179506.1.
(Continued)

*Primary Examiner* — Didarul A Mazumder
(74) *Attorney, Agent, or Firm* — Cantor Colburn LLP

(57) ABSTRACT

A quantum dot device including a first electrode and a second electrode facing each other, a quantum dot layer disposed between the first electrode and the second electrode and an electron auxiliary layer disposed between the quantum dot layer and the second electrode, wherein the electron auxiliary layer includes an electron-transporting material represented by Chemical Formula 1 and an electron-controlling material capable of decreasing electron mobility of the electron auxiliary layer, and a display device.

$$Zn_{1-x}M_xO$$ Chemical Formula 1

In Chemical Formula 1, M and x are the same as described in the detailed description.

21 Claims, 6 Drawing Sheets

(58) Field of Classification Search
CPC ............. H01L 33/0083; H01L 51/5088; H01L 51/5056; H01L 51/5072; C09K 11/883; G02F 1/01791; G02F 2001/01791; G01N 33/588; G02B 6/0229
See application file for complete search history.

(56) References Cited

U.S. PATENT DOCUMENTS

| | | | |
|---|---|---|---|
| 2009/0278141 A1* | 11/2009 | Coe-Sullivan | C09K 11/883 257/89 |
| 2015/0221815 A1* | 8/2015 | Clatterbuck | H01L 33/0004 362/293 |
| 2016/0005932 A1 | 1/2016 | Lee et al. | |
| 2017/0133550 A1* | 5/2017 | Schuele | H01L 33/0093 |
| 2018/0205030 A1* | 7/2018 | Meng | H01L 51/5076 |
| 2018/0346748 A1* | 12/2018 | Pan | C09D 11/037 |

FOREIGN PATENT DOCUMENTS

| | | |
|---|---|---|
| JP | 2008218801 A | 9/2008 |
| KR | 1220442 B1 | 1/2013 |
| KR | 1300560 B1 | 9/2013 |
| KR | 20160033520 A | 3/2016 |
| KR | 1626525 B1 | 6/2016 |

OTHER PUBLICATIONS

Hyo-Min Kim et al., "Metal-Oxide Stacked Electron Transport Layer for Highly Efficient Inverted Quantum-Dot Light Emitting Diodes," ACS Applied Materials & Interfaces, Oct. 3, 2016, pp. 28727-28736, vol. 8.

Jong-Hoon Kim et al., "Performance Improvement of Quantum Dot-Light-Emitting Diodes Enabled by an Alloyed ZnMg0 Nanoparticle Electron Transport Layer," Chemistry of Materials, Dec. 9, 2014, pp. 197-204, vol. 27.

Ozgur U et al., "A comprehensive review of ZnO materials and devices," Journal of Applied Physics, 2005, pp. 41301-1~041301-103, vol. 98, Issue 041301.

Sjoerd A. Veldhuis et al., "Crown Ethers Enable Room-Temperature Synthesis of CsPbBr 3 Quantum Dots for Light-Emitting Diodes," ACS Energy Letters, Feb. 1, 2018, pp. 523-531, vol. 3.

Hung Chia Wang et al., "Cadmium-Free InP/ZnSeS/ZnS Heterostructure-Based Quantum Dot Light-Emitting Diodes with a ZnMgO Electron Transport Layer and a Brightness of Over 10 000 cd m-2," Small, Advanced Science News, Jan. 31, 2017, pp. 1-7, vol. 13, Issue 13.

Summer R. Ferreira et al., "Effect of Zinc Oxide Electron Transport Layers on Performance and Shelf Life of Organic Bulk Heterojunction Devices," The Journal of Physical Chemistry, Jun. 21, 2011, pp. 13471-13475, vol. 115.

* cited by examiner

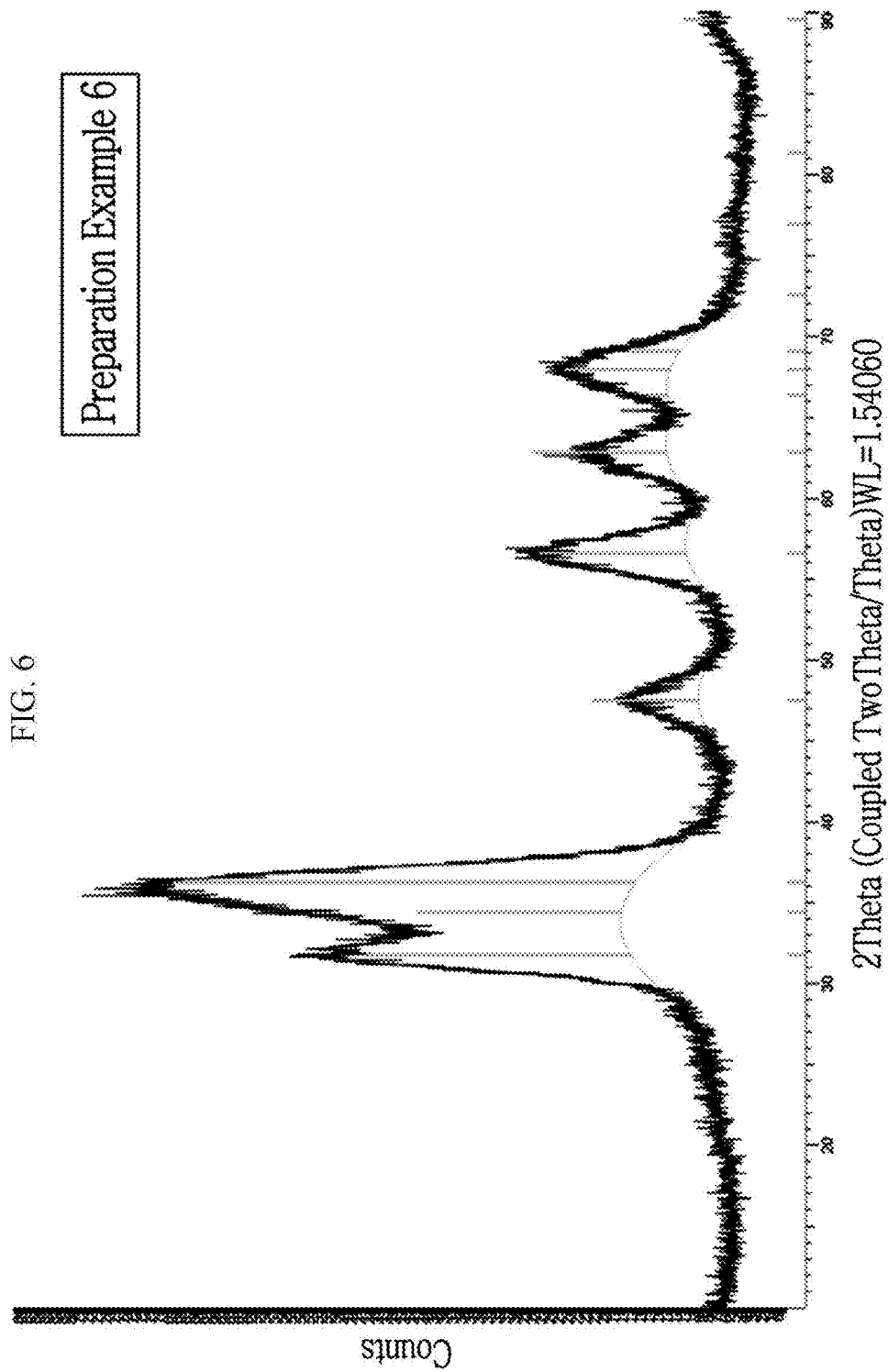

QUANTUM DOT DEVICE AND DISPLAY DEVICE

CROSS-REFERENCE TO RELATED APPLICATION

This application claims priority to and the benefit of Korean Patent Application No. 10-2018-0086209 filed in the Korean Intellectual Property Office on Jul. 24, 2018, and all the benefits accruing therefrom under 35 U.S.C. § 119, the entire content of which is incorporated herein by reference.

BACKGROUND

1. Field

A quantum dot device and a display device are disclosed.

2. Description of the Related Art

Physical characteristics (e.g., energy bandgaps, melting points, etc.) of nanoparticles that are intrinsic characteristics may be controlled by changing particle sizes, unlike bulk materials. For example, semiconductor nanocrystal particles also known as quantum dots may emit light in a wavelength corresponding to sizes of the quantum dots when being supplied with photoenergy or electrical energy. Accordingly, the quantum dots may be used as a light emitting element emitting light of a particular wavelength.

SUMMARY

A method of improving performance of a quantum dot device is desired.

An embodiment provides a quantum dot device capable of realizing, e.g., exhibiting, improved performance.

An embodiment provides an electronic device including the quantum dot device.

According to an embodiment, a quantum dot device includes a first electrode and a second electrode facing each other, a quantum dot layer disposed between the first electrode and the second electrode, and an electron auxiliary layer disposed between the quantum dot layer and the second electrode, wherein the electron auxiliary layer includes an electron-transporting material represented by Chemical Formula 1 and an electron-controlling material capable of decreasing electron mobility of the electron auxiliary layer.

 $Zn_{1-x}M_xO$ 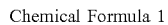 Chemical Formula 1

In Chemical Formula 1,
M is a metal except Zn, and
$0<x<0.5$.

A difference between lowest unoccupied molecular orbital (LUMO) energy levels of the electron auxiliary layer and the quantum dot layer may be greater than a difference between LUMO energy levels of ZnO and the quantum dot layer.

A difference between LUMO energy levels of the electron auxiliary layer and the quantum dot layer may be about 0.2 electronvolts (eV) to about 1.2 eV greater than a difference between LUMO energy levels of ZnO and the quantum dot layer.

A difference between LUMO energy levels of the electron auxiliary layer and the quantum dot layer may range from about 1.2 eV to about 2.0 eV.

A LUMO energy level of the quantum dot layer may range from about 2.5 eV to about 3.6 eV and a LUMO energy level of the electron auxiliary layer may range from about 3.7 eV to about 5.3 eV.

M may be Mg, Co, Ni, Zr, Mn, Sn, Y, Ga, Al, or a combination thereof.

The electron-controlling material may include an organic material, an inorganic material, an organic/inorganic material that has electron withdrawing characteristics, or a combination thereof.

The electron-controlling material may include an acetate, an acrylate, a propionate, a carboxylate, a cyano compound, an amine, an amide, a nitride, a nitrate, a halide, a sulfonyl compound, or a combination thereof.

The electron-controlling material may be present in an amount of about 3 weight percent (wt %) to about 50 wt %, based on a total amount of the electron-transporting material and the electron-controlling material.

The x of Chemical Formula 1 may satisfy the range, $0.05 \le x \le 0.3$ and the electron-controlling material may be present in an amount of about 10 wt % to about 30 wt %, based on a total amount of the electron-transporting material and the electron-controlling material.

The electron-transporting material and the electron-controlling material may be mixed.

The electron auxiliary layer may include a first electron auxiliary layer adjacent to the quantum dot layer and a second electron auxiliary layer adjacent to the second electrode, wherein one of the first electron auxiliary layer and the second electron auxiliary layer may include the electron-transporting material and the other of the first electron auxiliary layer and the second electron auxiliary layer may include the electron-controlling material.

An energy bandgap of the quantum dot layer may range from about 2.4 eV to about 2.9 eV.

The quantum dot layer may include a non-cadmium quantum dot.

The quantum dot layer may include a blue light emitting quantum dot having a peak emission wavelength of less than or equal to about 470 nanometers (nm).

The quantum dot may include zinc (Zn) and tellurium (Te), selenium (Se), or a combination thereof, or indium (In) and zinc (Zn), phosphorus (P), or a combination thereof.

The quantum dot may include a core including zinc (Zn) and tellurium (Te), selenium (Se), or a combination thereof, or indium (In) and zinc (Zn), phosphorus (P), or a combination thereof and a shell disposed on at least one part of the core and having a different composition from the core.

The shell may include ZnSeS, ZnS, or a combination thereof.

The first electrode may be an anode and the second electrode may be a cathode.

According to an embodiment, a display device including the quantum dot device is provided.

Performance of the quantum dot device may be improved.

BRIEF DESCRIPTION OF THE DRAWINGS

The above and other advantages and features of this disclosure will become more apparent by describing in further detail exemplary embodiments thereof with reference to the accompanying drawings, in which:

FIGS. 4 to 6 are XRD graphs of $Zn_{0.9}Co_{0.1}O$, $Zn_{0.95}Co_{0.05}O$, and $Zn_{0.98}Co_{0.02}O$ nanoparticles in solutions for an electron auxiliary layer obtained in Preparation Examples 4 to 6, respectively.

DETAILED DESCRIPTION

Figure 1:
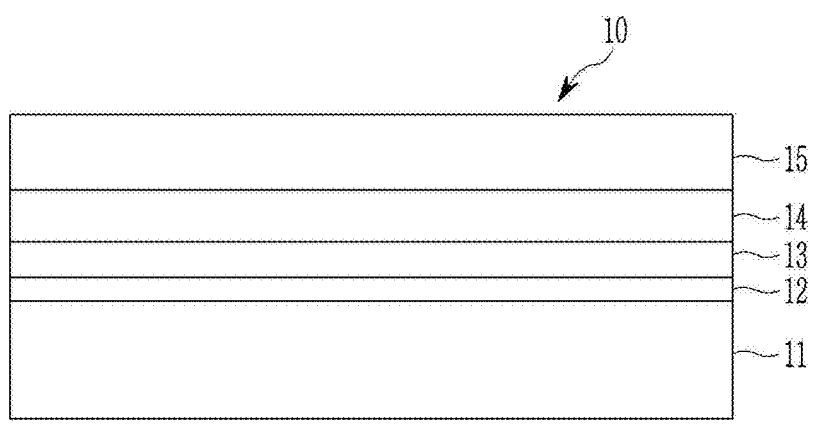
FIG. 1 is a schematic cross-sectional view of a quantum dot device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, a lowest unoccupied molecular orbital (LUMO) energy level, or a highest occupied molecular orbital (HOMO) energy level is expressed as an absolute value from a vacuum level. In addition, when the work function, a lowest unoccupied molecular orbital (LUMO) energy level, or the HOMO energy level is referred to be "deep," "high" or "large," the work function, a lowest unoccupied molecular orbital (LUMO) energy level, or the HOMO energy level has a large absolute value based on "0 eV" of the vacuum level, while when the work function, a lowest unoccupied molecular orbital (LUMO) energy level, or the HOMO energy level is referred to be "shallow," "low," or "small," the work function, a lowest unoccupied molecular orbital (LUMO) energy level, or HOMO energy level has a small absolute value based on "0 eV" of the vacuum level.

Hereinafter, a quantum dot device according to an embodiment is described with reference to drawings.

FIG. 1 is a schematic cross-sectional view of a quantum dot device according to an embodiment.

Referring to FIG. 1, a quantum dot device 10 according to an embodiment includes a first electrode 11 and a second electrode 15 facing each other, a quantum dot layer 13 disposed between the first electrode 11 and the second electrode 15, a hole auxiliary layer 12 disposed between the first electrode 11 and the quantum dot layer 13, and an electron auxiliary layer 14 disposed between the quantum dot layer 13 and the second electrode 15.

A substrate may be disposed at the side of the first electrode 11 or the second electrode 15. The substrate may be for example made of an inorganic material such as glass; an organic material such as polycarbonate, polymethyl methacrylate, polyethylene terephthalate, polyethylene naphthalate, polyamide, polyether sulfone, or a combination thereof; or a silicon wafer. The substrate may be omitted.

One of the first electrode 11 and the second electrode 15 is an anode and the other is a cathode. For example, the first electrode 11 may be an anode and the second electrode 15 may be a cathode.

The first electrode 11 may be made of a conductor having high work function, and may be for example made of a metal, a conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide;

or a combination of metal and oxide such as a combination of Al and ZnO or a combination of Sb and $SnO_2$, but is not limited thereto.

The second electrode 15 may be for example made of a conductor having a lower work function than the first electrode 11, and may be for example made of a metal, a conductive metal oxide, a conductive polymer, or a combination thereof. The second electrode 15 may be for example a metal or an alloy thereof such as aluminum, magnesium, calcium, sodium, potassium, titanium, indium, yttrium, lithium, gadolinium silver, tin, lead, cesium, barium, and the like; a multi-layer structure material such as LiF/Al, $LiO_2$/Al, 8-quinolinolato lithium (Liq)/Al, LiF/Ca, and $BaF_2$/Ca, but is not limited thereto.

A work function of the first electrode 11 may be greater than that of the second electrode 15. For example, the work function of the first electrode 11 may be for example about 4.5 eV to about 5.0 eV and the work function of the second electrode 15 may be for example greater than or equal to about 4.0 eV and less than about 4.5 eV. Within these ranges, the work function of the first electrode 11 may be for example about 4.6 eV to about 4.9 eV and the work function of the second electrode 15 may be for example about 4.0 eV to about 4.3 eV.

The first electrode 11, the second electrode 15, or a combination thereof may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

The quantum dot layer 13 includes a quantum dot. The quantum dot may be a semiconductor nanocrystal, and may have various shapes, for example a spherical semiconductor nanocrystal particle, a quantum rod, and a quantum plate. Herein, the quantum rod may indicate a quantum dot having an aspect ratio of greater than about 1:1, for example an aspect ratio of greater than or equal to about 2:1, greater than or equal to about 3:1, or greater than or equal to about 5:1. For example, the quantum rod may have an aspect ratio of less than or equal to about 50:1, for example less than or equal to about 30:1, or less than or equal to about 20:1.

The quantum dot may have for example a particle diameter (an average largest particle dimension for a non-spherical shape) of for example about 1 nm to about 100 nm, about 1 nm to about 80 nm, about 1 nm to about 50 nm, or about 1 nm to about 20 nm.

Energy bandgaps of quantum dots may be controlled according to sizes and compositions of the quantum dots, and thus the photoluminescence or electroluminescence wavelength may be controlled. For example, as the sizes of quantum dots increase, the quantum dots may have narrower energy bandgaps and thus emits light in a relatively long wavelength region while as the sizes of the quantum dots decrease, the quantum dots may have wide energy bandgap and thus emits light in a relatively short wavelength region.

For example, the quantum dot may emit for example light in a predetermined wavelength region of a visible ray region according to the size, composition, or a combination thereof of the quantum dot. For example, the quantum dot may emit blue light, red light, or green light, and the blue light may have for example a peak emission wavelength in a range of about 430 nm to about 470 nm, the red light may have for example a peak emission wavelength in a range of about 600 nm to about 650 nm, and the green light may have for example a peak emission wavelength in a range of about 520 nm to about 550 nm. For example, the quantum dot may emit blue light having a peak emission wavelength in a wavelength range of about 430 nm to about 470 nm.

For example, an average size of a blue light emitting quantum dot may be for example less than or equal to about 4.5 nm, less than or equal to about 4.3 nm, less than or equal to about 4.2 nm, less than or equal to about 4.1 nm, or less than or equal to about 4.0 nm. Within these ranges, an average size of a blue light emitting quantum dot may be for example about 2.0 nm to about 4.5 nm, about 2.0 nm to about 4.3 nm, about 2.0 nm to about 4.2 nm, about 2.0 about nm to about 4.1 nm, or about 2.0 nm to about 4.0 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM) in its electroluminescence spectrum. Herein, the FWHM a width of a wavelength corresponding to a half of a peak emission intensity and as the FWHM is narrower, light in a narrower wavelength region may be emitted and higher color purity may be obtained. The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm in its electroluminescence spectrum.

For example, the quantum dot may be for example a Group II-VI semiconductor compound, a Group III-V semiconductor compound, a Group IV-VI semiconductor compound, a Group IV semiconductor element or compound, a Group semiconductor compound, a Group I-II-IV-VI semiconductor compound, a Group II-III-V semiconductor compound, or a combination thereof. The Group II-VI semiconductor compound may be for example a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound of ZnSeSTe, HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto. The Group III-V semiconductor compound may be for example a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a combination thereof; or a quaternary element compound of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto. The Group IV-VI semiconductor compound may be for example a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; or a quaternary element compound of SnPbSSe, SnPbSeTe, SnPbSTe, or a combination thereof, but is not limited thereto. The Group IV semiconductor element or compound may be for example a singular element semiconductor compound of Si, Ge, or a combination thereof; or a binary element semiconductor compound of SiC, SiGe, or a combination thereof, but is not limited thereto. The Group semiconductor compound may be for example CuInSe$_2$, CuInS$_2$, CuInGaSe, CuInGaS, or a combination thereof, but is not limited thereto. The Group I-II-IV-VI semiconductor compound may be for example CuZnSnSe, CuZnSnS, or a combination thereof, but is not limited thereto. The Group II-III-V semiconductor compound may be for example InZnP, but is not limited thereto.

The quantum dot may include the binary semiconductor compound, the ternary semiconductor compound, or the quaternary semiconductor compound in a substantially uniform concentration or partially different concentration distributions.

For example, the quantum dot may include a non-cadmium-based quantum dot. Cadmium (Cd) may cause environment/health problems and is a restricted element by Restriction of Hazardous Substances Directive (RoHS) in a plurality of countries, and thus the non-cadmium-based quantum dot may be used.

For example, the quantum dot may be a semiconductor compound including zinc (Zn) and tellurium (Te), selenium (Se), or a combination thereof. For example, the quantum dot may be a Zn—Te semiconductor compound, a Zn—Se semiconductor compound, a Zn—Te—Se semiconductor compound, or a combination thereof. For example, in the Zn—Te—Se semiconductor compound, an amount of tellurium (Te) may be less than that of selenium (Se). The semiconductor compound may emit blue light having a peak emission wavelength in a wavelength region of less than or equal to about 470 nm, for example in a wavelength region of about 430 nm to about 470 nm.

For example, the quantum dot may be for example a semiconductor compound including indium (In) and zinc (Zn), phosphorus (P), or a combination thereof. For example, the quantum dot may be an In—Zn semiconductor compound, an In—P semiconductor compound, an In—Zn—P semiconductor compound, or a combination thereof. For example, in the In—Zn semiconductor compound or the In—Zn—P semiconductor compound, a mole ratio of zinc (Zn) relative to indium (In) may be greater than or equal to about 25:1. The semiconductor compound may emit blue light having a peak emission wavelength in a wavelength region of less than or equal to about 470 nm, for example in a wavelength region of about 430 nm to about 470 nm.

The quantum dot may have a core-shell structure wherein one quantum dot surrounds another quantum dot. For example, the core and the shell of the quantum dot may have an interface, and an element of the core, the shell, or a combination thereof in the interface may have a concentration gradient wherein the concentration of the element(s) decreases from the shell toward the core. For example, a material composition of the shell of the quantum dot has a higher, e.g., larger, energy bandgap than a material composition of the core of the quantum dot, and thereby the quantum dot may exhibit a quantum confinement effect.

The quantum dot may have one quantum dot core and a multi-layered quantum dot shell surrounding the core. Herein, the multi-layered shell has at least two shells wherein each shell may be a single composition, be an alloy, have a concentration gradient, or a combination thereof.

For example, a shell of a multi-layered shell that is far from the core may have a higher, e.g., larger, energy bandgap than a shell that is near to, e.g., adjacent to, the core, and thereby the quantum dot may exhibit a quantum confinement effect.

For example, the quantum dot having a core-shell structure may for example include a core including a first semiconductor compound including zinc (Zn) and tellurium (Te), selenium (Se), or a combination thereof and a shell disposed on at least one part of the core and including a second semiconductor compound having a different composition from that of the core.

A Zn—Te—Se-based first semiconductor compound may be for example a Zn—Se-based semiconductor compound including a small amount of tellurium (Te) and, for example, a semiconductor compound represented by ZnTe$_x$Se$_{1-x}$ (wherein, x is greater than about 0 and less than or equal to about 0.05).

For example, in the Zn—Te—Se-based first semiconductor compound, the mole amount of zinc (Zn) may be greater than that of selenium (Se), and the mole amount of selenium (Se) may be greater than that of tellurium (Te). For example, in the first semiconductor compound, a mole ratio of tellurium (Te) relative to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. For example, in the first semiconductor compound, a mole ratio of tellurium (Te) relative to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

The second semiconductor compound may include for example a Group II-VI semiconductor compound, a Group III-V semiconductor compound, a Group IV-VI semiconductor compound, a Group IV semiconductor element or compound, a Group I-III-VI semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group I-III-VI semiconductor compound, the Group I-II-IV-VI semiconductor compound, and the Group II-III-V semiconductor compound are the same as described above.

For example, the second semiconductor compound may include zinc (Zn), and selenium (Se), sulfur (S), or a combination thereof. For example, the shell may include at least one internal shell disposed near to, e.g., adjacent, the core and an outermost shell disposed at the outermost shell of the quantum dot and the internal shell may include ZnSeS and the outermost shell may include SnS. For example, the shell may have a concentration gradient of one component and for example an amount of sulfur (S) may increase as being apart from the core.

For example, the quantum dot having a core-shell structure may include for example a core including a third semiconductor compound including indium (In) and zinc (Zn), phosphorus (P), or a combination thereof and a shell disposed on at least one part of the core and including a fourth semiconductor compound having a different composition from the core.

In the In—Zn—P-based third semiconductor compound, a mole ratio of zinc (Zn) relative to indium (In) may be greater than or equal to about 25:1. For example, in the In—Zn—P-based third semiconductor compound, the mole ratio of zinc (Zn) relative to indium (In) may be greater than or equal to about 28:1, greater than or equal to about 29:1, or greater than or equal to about 30:1. For example, in the In—Zn—P-based third semiconductor compound, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1, or less than or equal to about 32:1.

The fourth semiconductor compound may include for example a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof. Examples of the Group II-VI semiconductor compound, the Group III-V semiconductor compound, the Group IV-VI semiconductor compound, the Group IV semiconductor element or compound, the Group semiconductor compound, the Group I-II-IV-VI semiconductor compound, and the Group II-III-V semiconductor compound are the same as described above. For example, the fourth semiconductor compound may include zinc (Zn) and sulfur (S), and optionally selenium (Se). For example, the shell may include at least one internal shell disposed near to, e.g., adjacent to, the core and an outermost shell disposed to be farthest from the core of the quantum dot and the internal shell, the outermost shell, or a combination thereof may include the fourth semiconductor compound of ZnS or ZnSeS.

The quantum dot layer 13 may have for example a thickness of about 5 nm to about 200 nm, for example about 10 nm to about 150 nm, about 10 nm to about 100 nm, or about 10 nm to about 50 nm.

The quantum dot layer 13 may have a relatively high HOMO energy level and may have for example a HOMO energy level of greater than or equal to about 5.4 eV, greater than or equal to about 5.6 eV, greater than or equal to about 5.7 eV, greater than or equal to about 5.8 eV, greater than or equal to about 5.9 eV or greater than or equal to about 6.0 eV. The HOMO energy level of the quantum dot layer 13 may be for example about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV, and within these ranges, for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, or about 5.6 eV to about 6.1 eV, for example about 5.7 eV to about 7.0 eV, about 5.7 eV to about 6.8 eV, about 5.7 eV to about 6.7 eV, about 5.7 eV to about 6.5 eV, about 5.7 eV to about 6.3 eV, about 5.7 eV to about 6.2 eV, or about 5.7 eV to about 6.1 eV, for example about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, for example about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The quantum dot layer 13 may have a relatively low LUMO energy level, and may have for example an LUMO energy level of less than or equal to about 3.6 eV, for example less than or equal to about 3.5 eV, less than or equal to about 3.4 eV, less than or equal to about 3.3 eV, less than or equal to about 3.2 eV, or less than or equal to about 3.0 eV. The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, or about 2.5 eV to about 3.0 eV.

The quantum dot layer 13 may have an energy bandgap of about 2.4 eV to about 2.9 eV. Within this range, the quantum dot layer 13 may have for example an energy bandgap of about 2.4 eV to about 2.8 eV, for example about 2.4 eV to about 2.78 eV.

The hole auxiliary layer 12 is disposed between the first electrode 11 and the quantum dot layer 13. The hole auxiliary layer 12 may have one layer or two or more layers, may for example help ease injection, transport, or a combination thereof of charges such as holes from the first electrode 11 into the quantum dot layer 13, and may include for example a hole injection layer, a hole transport layer, an electron blocking layer, or a combination thereof.

The hole auxiliary layer 12 may have a relatively high HOMO energy level so that the hole auxiliary layer 12 may match a HOMO energy level of the quantum dot layer 13. Accordingly, mobility of holes from the hole auxiliary layer 12 into the quantum dot layer 13 may be increased.

The hole auxiliary layer 12 may have the same HOMO energy level as the quantum dot layer 13 or a smaller, e.g., lower, HOMO energy level than the quantum dot layer 13 by about 1.0 eV or less. For example, a difference between HOMO energy levels of the quantum dot layer 13 and the hole auxiliary layer 12 may be about 0 eV to about 1.0 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The hole auxiliary layer 12 may have a HOMO energy level of for example greater than or equal to about 5.0 eV, greater than or equal to about 5.2 eV, greater than or equal to about 5.4 eV, greater than or equal to about 5.6 eV, or greater than or equal to about 5.8 eV.

For example, the hole auxiliary layer 12 may have a HOMO energy level of about 5.0 eV to about 7.0 eV, for example about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

For example, the hole auxiliary layer 12 may include a hole injection layer near to, e.g., adjacent to, the first electrode 11 and a hole transport layer near to, e.g., adjacent to, the quantum dot layer 13. Herein, the hole injection layer may have a HOMO energy level of about 5.0 eV to about 6.0 eV, about 5.0 eV to about 5.5 eV, or about 5.0 eV to about 5.4 eV, and the hole transport layer may have a HOMO energy level of about 5.2 eV to about 7.0 eV, for example about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

The hole auxiliary layer 12 may include a suitable material satisfying the energy level without a particular limit and may be for example poly[(9,9-dioctyl-fluorene)-co-(N-(4-butylphenyl)-diphenylamine)] (TFB), polyarylamine, poly (N-vinylcarbazole, poly(3,4-ethylenedioxythiophene) (PEDOT), poly(3,4-ethylenedioxythiophene) polystyrene sulfonate (PEDOT:PSS), polyaniline, polypyrrole, N,N,N', N'-tetrakis(4-methoxyphenyl)-benzidine (TPD), (4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis [(di-4-tolylamino)phenyl]cyclohexane (TAPC), p-type metal oxide (e.g., NiO, WO$_3$, MoO$_3$, etc.), a carbon-based material such as graphene oxide, and a combination thereof, but is not limited thereto.

The electron auxiliary layer 14 is disposed between the quantum dot layer 13 and the second electrode 15. The electron auxiliary layer 14 may have one layer or two or more layers, and may for example help ease injection, transport, or a combination thereof of charges such as electrons from the second electrode 15 into the quantum dot layer 13, or may control mobility rates of charges such as electrons. The electron auxiliary layer 14 may be one layer including a combination of an electron transport material and an electron controlling material. The electron auxiliary layer 14 may include for example an electron transport layer and an electron controlling layer, and optionally an electron injection layer, a hole blocking layer, or a combination thereof, but is not limited thereto.

For example, the electron auxiliary layer 14 may include an electron-transporting material and an electron-controlling material. The electron-transporting material is a material having electron characteristics which may maintain or increase electron mobility and the electron-controlling material is a material capable of decreasing electron mobility. In this way, the electron auxiliary layer 14 may control transport rates of electrons by including the electron-transporting material and the electron-controlling material, and thus have a balance between holes and electrons.

For example, the electron-transporting material and the electron-controlling material may be mixed in the electron auxiliary layer 14.

The electron-transporting material may be for example represented by Chemical Formula 1.

$$Zn_{1-x}M_xO \qquad \text{Chemical Formula 1}$$

In Chemical Formula 1,
M is a metal except Zn, and
0<x<0.5.

The electron-transporting material represented by Chemical Formula 1 may include zinc (Zn) and the metal except zinc in a predetermined ratio, and thus may control an energy level of the electron-transporting material and decrease a leakage current.

For example, M of Chemical Formula 1 may be for example Mg, Co, Ni, Zr, Mn, Sn, Y, Ga, Al, or a combination thereof, but is not limited thereto.

For example, x of Chemical Formula 1 may satisfy for example 0.01≤x≤0.4, 0.03≤x≤0.3, or 0.05≤x≤0.3, but is not limited thereto.

The electron-transporting material represented by Chemical Formula 1 may have a smaller average particle size than zinc oxide (ZnO) and may have an average particle size of for example less than about 3.5 nm, less than or equal to about 3.4 nm, less than or equal to about 3.3 nm, less than or equal to about 3.2 nm, less than or equal to about 3.1 nm, or less than or equal to about 3.0 nm. The electron-transporting material represented by Chemical Formula 1 may have an average particle size of for example greater than or equal to about 1.2 nm and less than 3.5 nm, greater than or equal to about 1.3 nm and less than 3.4 nm, about 1.5 nm to about 3.3 nm, about 1.8 nm to about 3.3 nm, or about 2.0 nm to about 3.3 nm.

The electron-transporting material represented by Chemical Formula 1 may have a different energy level from zinc oxide (ZnO). For example, a LUMO energy level of the electron-transporting material represented by Chemical Formula 1 may be different from a LUMO energy level of the zinc oxide (ZnO), and for example the LUMO energy level of the electron-transporting material represented by Chemical Formula 1 may be deeper than the LUMO energy level of the zinc oxide (ZnO). For example, a HOMO energy level of the electron-transporting material represented by Chemical Formula 1 may be different from a HOMO energy level of zinc oxide (ZnO), and for example the HOMO energy level of the electron-transporting material represented by Chemical Formula 1 may be deeper than the HOMO energy level of the zinc oxide (ZnO).

The electron-controlling material may include a suitable material decreasing electron transport characteristics or delaying an electron transport rate of the electron-transporting material, that is, decreasing electron mobility without a particular limit, for example, an organic material, an inorganic material, an organic/inorganic material, or a combination thereof.

For example, the electron-controlling material may be a material having electron withdrawing characteristics and may include for example an organic material, an inorganic material, an organic/inorganic material that has electron withdrawing characteristics, or a combination thereof. For example, the electron-controlling material may include an acetate, an acrylate, a propionate, a carboxylate, a cyano compound, an amine, an amide, a nitride, a nitrate, a halide compound, a sulfonyl compound, or a combination thereof, but is not limited thereto.

An amount of the electron-controlling material may be adjusted according to electron mobility desired in the electron auxiliary layer 14 and the electron-controlling material may be for example included in in an amount of about 3 wt % to about 50 wt %, based on a total amount of the electron-transporting material and the electron-controlling material. When the electron-controlling material is included within this range, transport rates of electrons may be desirably controlled so that holes and electrons may be balanced. Within this range, the electron-controlling material may be included in an amount of about 3 wt % to about 40 wt %, about 3 wt % to about 30 wt %, or about 5 wt % to about 30 wt %.

The electron auxiliary layer 14 may have a different energy level from zinc oxide (ZnO) or a zinc oxide layer consisting of zinc oxide (ZnO) by including the electron-transporting material represented by Chemical Formula 1 and the electron-controlling material together. For example, a LUMO energy level of the electron auxiliary layer 14 may be different from a LUMO energy level of the zinc oxide (ZnO) or zinc oxide layer and for example the LUMO energy level of the electron auxiliary layer 14 may be deeper than the LUMO energy level of the zinc oxide (ZnO) or zinc oxide layer. For example, a HOMO energy level of the electron auxiliary layer 14 may be different from a HOMO energy level of the zinc oxide (ZnO) or zinc oxide layer, and for example the HOMO energy level of the electron auxiliary layer 14 may be deeper than the HOMO energy level of the zinc oxide (ZnO) or zinc oxide layer.

An energy level difference between the electron auxiliary layer 14 and the quantum dot layer 13 may be changed depending on such an energy level change of the electron auxiliary layer 14. For example, a difference between LUMO energy levels of the electron auxiliary layer 14 and the quantum dot layer 13 may be greater than a difference between LUMO energy levels of the zinc oxide (ZnO) or zinc oxide layer and the quantum dot layer 13.

Accordingly, mobility of electrons reaching the quantum dot layer 13 from the second electrode 15 through the electron auxiliary layer 14 may be decreased compared with an electron auxiliary layer formed of zinc oxide (ZnO). Since a quantum dot device, particularly, a quantum dot device including a non-cadmium-based quantum dot in the quantum dot layer 13 has faster, e.g., greater, hole mobility than electron mobility and thus may cause an imbalance between holes and electrons, an embodiment may appropriately lower mobility of electrons reaching the quantum dot layer 13 from the second electrode 15 and thus balance between holes and electrons. Accordingly, luminous efficiency of the quantum dot device 10 may be improved.

For example, a difference between LUMO energy levels of the electron auxiliary layer 14 and the quantum dot layer 13 may be greater than a difference between LUMO energy levels of the zinc oxide (ZnO) or zinc oxide layer and the quantum dot layer 13 by for example about 0.2 eV to about 1.2 eV, about 0.3 eV to about 1.1 eV, or about 0.4 eV to about 1.1 eV.

For example, a difference between LUMO energy levels of the electron auxiliary layer 14 and the quantum dot layer 13 may be about 1.2 eV to about 2.0 eV, about 1.3 eV to about 1.8 eV, or about 1.35 eV to about 1.7 eV.

For example, the LUMO energy level of the quantum dot layer 13 may be about 2.5 eV to about 3.6 eV and the LUMO energy level of the electron auxiliary layer 14 may be about 3.7 eV to about 5.3 eV.

The quantum dot device 10 may further include additional layers between each layer.

The hole auxiliary layer 12, the quantum dot layer 13, and the electron auxiliary layer 14 may be for example formed with a solution process, for example a spin coating, a slit coating, inkjet printing, a nozzle printing, spraying, a doctor blade coating, or a combination thereof, but is not limited thereto.

For example, the electron auxiliary layer 14 may be formed from a solution including a Zn salt and an M salt (M is the same as described above) for forming the electron-transporting material represented by Chemical Formula 1, and a supply ratio of the Zn salt and the M salt may be adjusted to obtain a desired composition. Herein, the electron-controlling material of the electron auxiliary layer 14 may be supplied from the Zn salt, the M salt, or a combination thereof for forming the electron-transporting material represented by Chemical Formula 1, another Zn salt, another M salt, or a combination thereof in addition to the Zn salt, the M salt, or the combination thereof for forming the electron-transporting material represented by Chemical Formula 1, or additional materials in addition to the Zn salt, M salt, or the combination thereof.

The quantum dot device 10 according to an embodiment includes the electron auxiliary layer including the electron-transporting material and the electron-controlling material and accordingly, may appropriately control mobility of electrons from the second electrode 15 to the quantum dot layer 13 and thus balance the mobility of electrons with mobility of holes from the first electrode 11 to the quantum dot layer 13. Accordingly, efficiency of the quantum dot device 10 may be improved.

Figure 2:
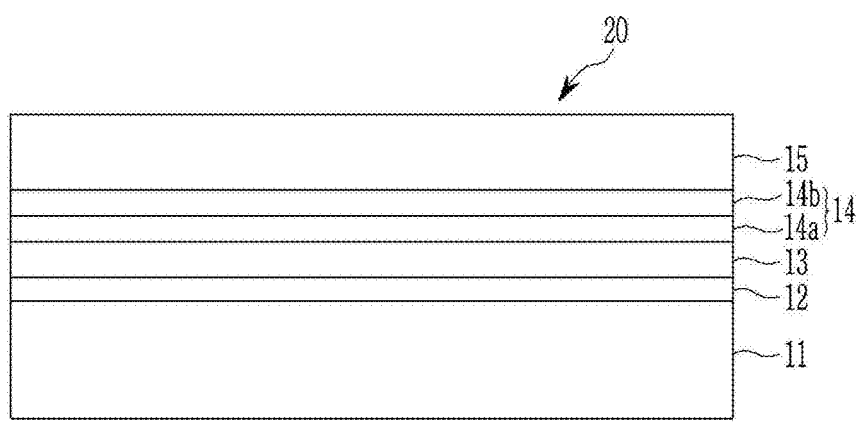
FIG. 2 is a schematic cross-sectional view of a quantum dot device according to an embodiment.

FIG. 2 is a schematic cross-sectional view of a quantum dot device according to an embodiment.

Referring to FIG. 2, the quantum dot device 20 according to an embodiment includes a first electrode 11, a hole auxiliary layer 12, a quantum dot layer 13, an electron auxiliary layer 14, and a second electrode 15, like the above embodiment. The first electrode 11, the hole auxiliary layer 12, the quantum dot layer 13, and the second electrode 15 are the same as described above.

However, the quantum dot device 20 according to an embodiment includes the electron auxiliary layer 14 including a first electron auxiliary layer 14a and a second electron auxiliary layer 14b, unlike the above embodiment.

The first electron auxiliary layer 14a and the second electron auxiliary layer 14b may be disposed between the quantum dot layer 13 and the second electrode 15 wherein the first electron auxiliary layer 14a may be disposed to be near to, e.g., adjacent to, the quantum dot layer 13 and the second electron auxiliary layer 14b may be disposed to be near to, e.g., adjacent to, the second electrode 15.

One of the first electron auxiliary layer 14a and the second electron auxiliary layer 14b may include the electron-transporting material and the other of the first electron auxiliary layer 14a and the second electron auxiliary layer 14b may include the electron-controlling material. For example, the first electron auxiliary layer 14a may include the electron-transporting material and the second electron auxiliary layer 14b may include the electron-controlling material. For example, the first electron auxiliary layer 14a may include the electron-controlling material and the second electron auxiliary layer 14b may include the electron-transporting material.

The quantum dot device 20 may further include additional layers between each layer.

The quantum dot device 20 according to an embodiment includes the electron auxiliary layer including a layer including the electron-transporting material and a layer including the electron-controlling material and accordingly, may appropriately control mobility of electrons from the second electrode 15 to the quantum dot layer 13 and thus balance the mobility of electrons with mobility of holes moving from the first electrode 11 to the quantum dot layer 13. Accordingly, efficiency of the quantum dot device 20 may be improved.

The quantum dot device may be for example applied to various electronic devices such as display devices or lighting devices, and the like.

Hereinafter, the embodiments are illustrated in more detail with reference to examples. However, these examples are exemplary, and the present disclosure is not limited thereto.

Synthesis Example: Synthesis of Quantum Dot (1) Synthesis of ZnTeSe Core

Selenium (Se) and tellurium (Te) are respectively dispersed in trioctylphosphine (TOP) to obtain a 2 molar (M) Se/TOP stock solution and a 0.1 M Te/TOP stock solution. 0.125 millimoles (mmol) of zinc acetate, 0.25 mmol of oleic acid, and 0.25 mmol of hexadecylamine are mixed with 10 milliliters (mL) of trioctylamine in a reactor and then, heated to 120° C. under vacuum. After 1 hour, an atmosphere in the reactor is substituted with nitrogen.

After heating the reactor at 300° C., the Se/TOP stock solution and the Te/TOP stock solution are rapidly added thereto in a Te/Se ratio of 1/25. After 30 minutes, the reaction solution is rapidly cooled down to room temperature, acetone is added thereto, and a precipitate obtained by centrifuging the mixture is dispersed in toluene to obtain a toluene dispersion of a ZnTeSe quantum dot.

(2) Synthesis of ZnTeSe Core/ZnSeS Shell Quantum Dot 1.8 mmol (0.336 grams (g)) of zinc acetate, 3.6 mmol (1.134 g) of oleic acid, and 10 mL of trioctylamine are put into a flask and subjected to vacuum conditions at 120° C. for 10 minutes. The inside of the flask is supplied with nitrogen ($N_2$) and the flask is heated to 180° C. The toluene dispersion of ZnTeSe quantum dot as core obtained in "(1) Synthesis of ZnTeSe Core" is put in the flask within 10 seconds, subsequently, 0.04 mmol of Se/TOP is slowly injected and then heated to 280° C. Then, 0.01 mmol of S/TOP (sulfur dispersed in trioctylphosphine) is put thereto and heated to 320° C. and reacted for 10 minutes. Continuously, a mixed solution of 0.02 mmol of Se/TOP and 0.04 mmol of S/TOP is slowly injected and reacted again for 20 minutes. Then, the step of injecting Se and S by changing the mixing ratio thereof and reacting the same for 20 minutes is repeated, wherein a mixed solution of 0.01 mmol Se/TOP+ 0.05 mmol S/TOP, a mixed solution of 0.005 mmol Se/TOP+0.1 mmol S/TOP, and a solution of 0.5 mmol S/TOP are used, sequentially. After completing all the reaction, the reactor is cooled, the prepared nanocrystal is precipitated with ethanol, and the obtained nanocrystal is separated by centrifugation and dispersed in toluene to obtain a toluene dispersion of a ZnTeSe/ZnSeS core/shell quantum dot.

Preparation Example: Preparation of Solution for Electron Auxiliary Layer

Preparation Example 1

3.06 mmol of zinc acetate dihydrate, 0.54 mmol of magnesium acetate tetrahydrate, and 30 mL of dimethyl-sulfoxide are put into a reactor and dissolved therein. Subsequently, 5.5 mmol of tetramethylammonium hydroxide (TMAH) pentahydrate is dissolved in 10 mL of ethanol, and the solution is put into the above reactor. The mixture is stirred for 1 hour to prepare $Zn_{0.85}Mg_{0.15}O$ nanoparticles. The $Zn_{0.85}Mg_{0.15}O$ nanoparticles are mixed with ethyl acetate in a volume ratio of 1:4 and the obtained mixture is centrifuged and the resultant is dispersed in ethanol to obtain a $Zn_{0.85}Mg_{0.15}O$ nanoparticle (an average particle diameter: about 3 nanometers (nm))-containing solution for an electron auxiliary layer.

Preparation Example 2

A solution for an electron auxiliary layer is prepared according to the same method as Preparation Example 1 except for synthesizing $Zn_{0.9}Mg_{0.1}O$ nanoparticles by using 2.97 mmol of zinc acetate dihydrate and 0.33 mmol of magnesium acetate tetrahydrate.

Preparation Example 3

A solution for an electron auxiliary layer is prepared according to the same method as Preparation Example 1 except for synthesizing $Zn_{0.95}Mg_{0.05}O$ nanoparticles by using 2.99 mmol of zinc acetate dihydrate and 0.16 mmol of magnesium acetate tetrahydrate.

Preparation Example 4

A solution for an electron auxiliary layer is prepared according to the same method as Preparation Example 1 except for synthesizing $Zn_{0.9}Co_{0.1}O$ nanoparticles by using 2.97 mmol of zinc acetate dihydrate and 0.33 mmol of cobalt acetate tetra hydrate.

Preparation Example 5

A solution for an electron auxiliary layer is prepared according to the same method as Preparation Example 1 except for synthesizing $Zn_{0.95}Co_{0.05}O$ nano particles by using 2.99 mmol of zinc acetate dihydrate and 0.16 mmol of cobalt acetate tetrahydrate.

Preparation Example 6

A solution for an electron auxiliary layer is prepared according to the same method as Preparation Example 1 except for synthesizing $Zn_{0.98}Co_{0.02}O$ nanoparticles by using 2.94 mmol of zinc acetate dihydrate and 0.06 mmol of cobalt acetate tetrahydrate.

Preparation Example 7

3.06 mmol of zinc acetate dihydrate and 0.54 mmol of magnesium acetate tetrahydrate are dissolved in 30 mL of dimethylsulfoxide in a reactor. Subsequently, 5.5 mmol of tetramethylammonium hydroxide (TMAH) pentahydrate is dissolved in 10 mL of ethanol and then, put into the reactor. The mixture is stirred for 1 hour to prepare $Zn_{0.85}Mg_{0.15}O$ nanoparticle, the $Zn_{0.85}Mg_{0.15}O$ nanoparticles are mixed with ethyl acetate in a volume ratio of 1:4, and the obtained mixture is centrifuged and dispersed in ethanol to obtain a solution including $Zn_{0.85}Mg_{0.15}O$ nanoparticles (an average particle diameter: about 3 nm). Subsequently, 0.3 mmol of zinc acetate (Zn acetate) is added to the solution, and the obtained mixture is stirred at room temperature for 1 hour to prepare a solution for an electron auxiliary layer.

Comparative Preparation Example 1

3.00 mmol of zinc acetate dihydrate is dissolved in 30 mL of dimethylsulfoxide in a reactor. Subsequently, 5.5 mmol of tetramethylammonium hydroxide (TMAH) pentahydrate is dissolved in 10 mL of ethanol and then, put into a zinc solution. The obtained mixture is stirred for 1 hour to prepare ZnO nanoparticles. The ZnO nanoparticles are mixed with ethyl acetate in a volume ratio of 1:4 and the obtained mixture is centrifuged and the resultant is dispersed in ethanol to obtain a solution including the ZnO nanoparticles dispersed therein.

Evaluation I

A crystal structure of the nanoparticles in the solutions for an electron auxiliary layer according to Preparation Examples 1 to 6 and Comparative Preparation Example 1 is examined.

The crystal structure is examined through an X-ray diffraction (XRD) analysis by using Philips XPert PRO with power 3 kW.

Figure 3:
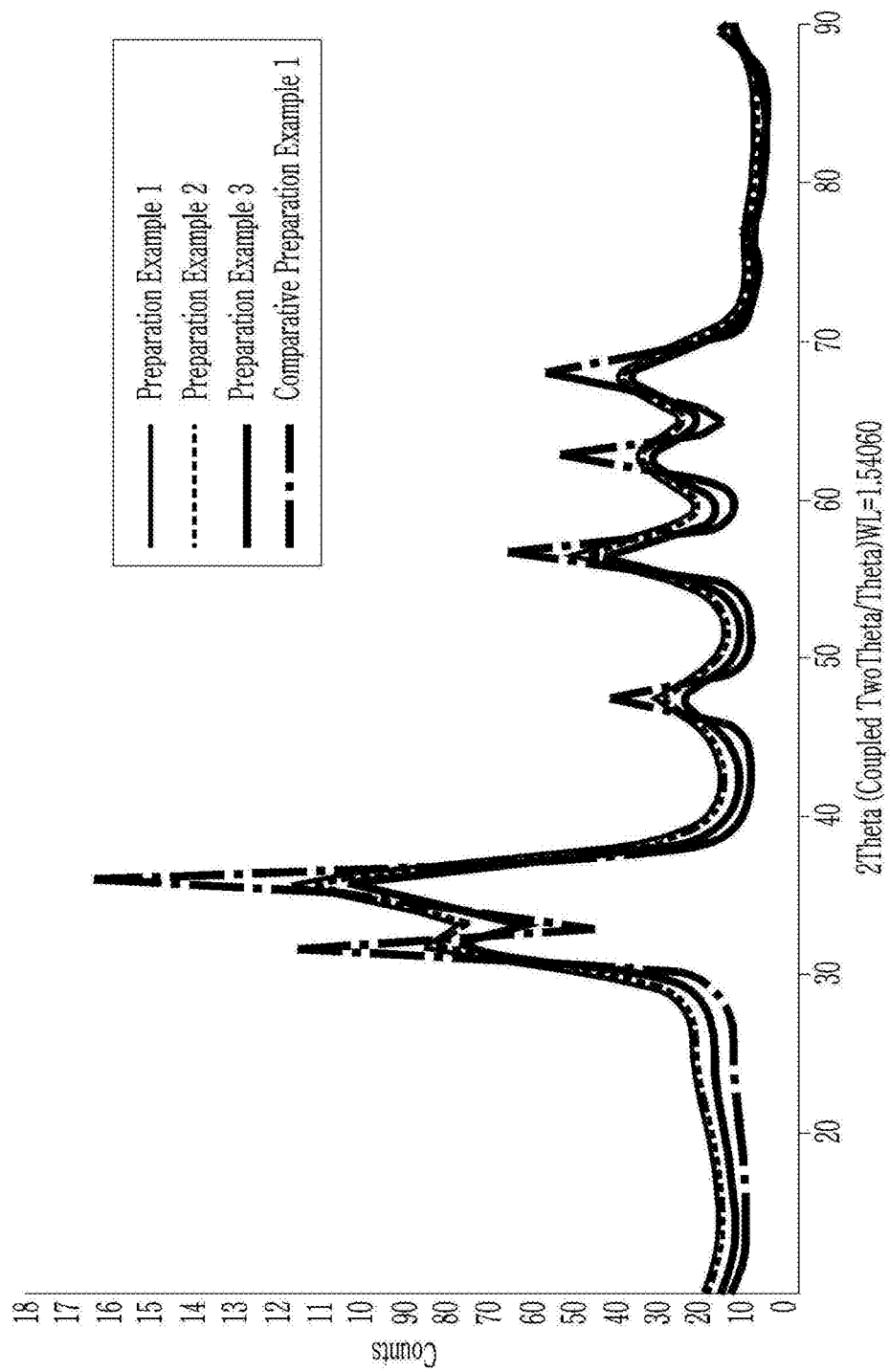
FIG. 3 is an X-ray diffraction (XRD) graph of $Zn_{0.85}Mg_{0.15}O$, $Zn_{0.9}Mg_{0.1}O$, $Zn_{0.95}Mg_{0.05}O$, and ZnO nanoparticles in solutions for an electron auxiliary layer obtained in Preparation Examples 1 to 3 and Comparative Preparation Example 1.
Figure 4:
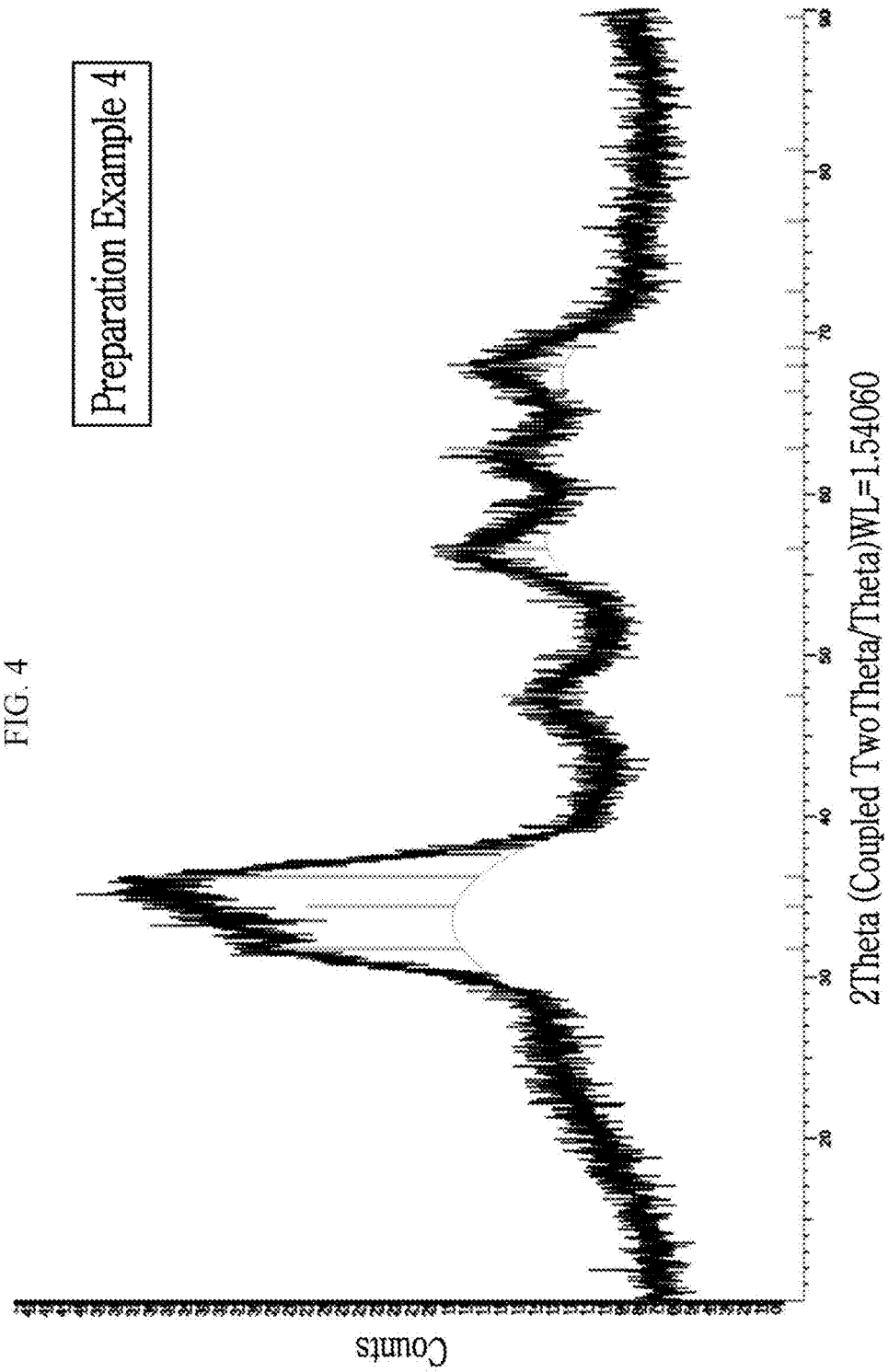
Figure 5:
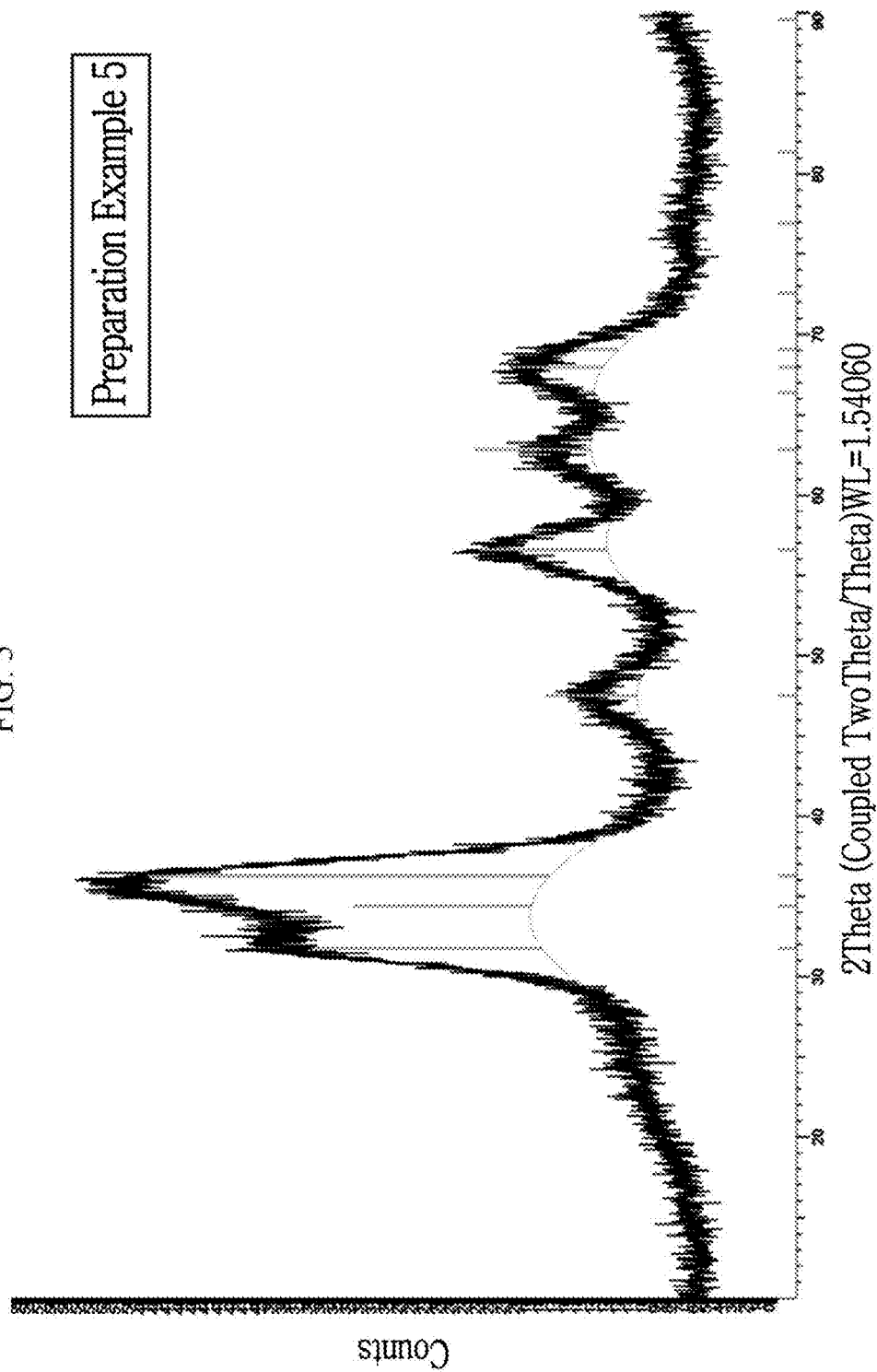

FIG. 3 is an XRD graph of $Zn_{0.85}Mg_{0.15}O$, $Zn_{0.9}Mg_{0.1}O$, $Zn_{0.95}Mg_{0.05}O$, and ZnO nanoparticles in solutions for an electron auxiliary layer obtained in Preparation Examples 1 to 3 and Comparative Preparation Example 1 and FIGS. 4 to 6 are XRD graphs of $Zn_{0.9}Co_{0.1}O$, $Zn_{0.95}Co_{0.05}O$, and $Zn_{0.98}Co_{0.02}O$ nanoparticles in solutions for an electron auxiliary layer obtained in Preparation Examples 4 to 6, respectively.

Evaluation II

The solutions for an electron auxiliary layer according to Preparation Example 1 to 3 and Comparative Preparation Example 1 are respectively used to manufacture each electron only devices (EOD) for a sample. The EOD for a sample is manufactured as follows.

The solutions for an electron auxiliary layer according to Preparation Examples 1 to 3 and Comparative Preparation Example 1 are respectively spin-coated to be 60 nm thick on an indium tin oxide (ITO) substrate and heat-treated at 80° C. for 30 minutes.

Subsequently, 50 nm-thick of NET204 (Novaled):Liq (volume ratio=1:1), 0.5 nm-thick of Liq, and 100 nm-thick of an Al electrode are sequentially deposited on the thin film to manufacture the EOD for a sample.

The EOD for a sample is examined through ICP, FT-IR, and TGA analyses to obtain each content of Zn, Mg, and acetate in the thin film.

The results are shown in Table 1.

TABLE 1

|  | Zn (mol %) | Mg (mol %) | Acetate (wt %) |
| --- | --- | --- | --- |
| Preparation Example 1 | 85 | 15 | 23.5 |
| Preparation Example 2 | 90 | 10 | 20.6 |
| Preparation Example 3 | 95 | 5 | 17.0 |
| Comparative Preparation Example 1 | 100 | 0 | 12.2 |

In Table 1, each of Zn (mol %) and Mg (mol %) is based on the total molar amount of Zn and Mg, and Acetate (wt %) is based on the total weight of the electron-transporting material and the electron-controlling material in the electron auxiliary layer.

A current change of the EOD for a sample is examined. The current change is examined by using a Measurement Equipment system (McScience Inc.).

The results are shown in Table 2.

TABLE 2

|  | Amount of current (milliamperes per square centimeter (mA/cm$^2$) (@ 8 volts (V))) |
| --- | --- |
| Preparation Example 1 | 56 |
| Preparation Example 2 | 58 |
| Preparation Example 3 | 129 |
| Comparative Preparation Example 1 | 339 |

Referring to Table 2, a current amount is changed depending on a Mg doping amount and a content of acetate (an organic material), and specifically, the more the Mg doping amount and the content of acetate (an organic material) are, the smaller, e.g., lesser, the current amount is. Accordingly, the current amount may be adjusted depending on the Mg doping amount and the content of acetate (an organic material), and accordingly, electron mobility may be adjusted by controlling the Mg doping amount and the content of acetate (an organic material).

Manufacture of Quantum Dot Device

Example 1

A glass substrate deposited with 100 nm-thick ITO (work function (WF): 4.8 electronvolts (eV)) as a first electrode (anode) is surface-treated with an ultraviolet (UV)-ozone for 15 minutes, spin-coated with a poly(3,4-ethylenedioxythiophene) polystyrene sulfonate (PEDOT:PSS) solution (H.C. Starks Co., Ltd.), and heat-treated under the air atmosphere at 150° C. for 10 minutes and then, under an $N_2$ atmosphere at 150° C. for 10 minutes to form a 25 nm-thick hole injection layer (highest occupied molecular orbital (HOMO): 5.3 eV and lowest unoccupied molecular orbital (LUMO): 2.7 eV). Subsequently, on the hole injection layer, a 25 nm-thick hole transport layer (HOMO: 5.6 eV and LUMO: 2.69 eV) is formed by spin-coating poly[(9,9-dioctylfluorenyl-2,7-diyl-co(4,4'-(N-4-butylphenyl)diphenylamine] solution (TFB) (Sumitomo) and heat-treating the same at 150° C. for 30 minutes. On the hole transport layer, a 25 nm-thick quantum dot layer (HOMO: 5.7 eV and LUMO: 2.97 eV) is formed by spin-coating the toluene dispersion of the ZnTeSe/ZnSeS core/shell quantum dot obtained in Synthesis Example and heat-treating the same at 80° C. for 30 minutes. On the quantum dot layer, a 20 nm-thick electron auxiliary layer (HOMO: 8.35 eV and LUMO: 4.60 eV) is formed by spin-coating the solution for an electron auxiliary layer obtained in Preparation Example 1 and heat-treating the same at 80° C. for 30 minutes. On the electron auxiliary layer, a second electrode (cathode) is formed by vacuum-depositing aluminum (Al) to be 90 nm to manufacture a quantum dot device.

Example 2

A quantum dot device is manufactured according to the same method as Example 1 except for forming an electron auxiliary layer (HOMO: 8.17 eV and LUMO: 4.48 eV) by using the solution for an electron auxiliary layer according to Preparation Example 2 instead of the solution for an electron auxiliary layer according to Preparation Example 1.

Example 3

A quantum dot device is manufactured according to the same method as Example 1 except for forming an electron auxiliary layer (HOMO: 7.99 eV, LUMO: 4.37 eV) by using the solution for an electron auxiliary layer according to Preparation Example 3 instead of the solution for an electron auxiliary layer according to Preparation Example 1.

Example 4

A quantum dot device is manufactured according to the same method as Example 1 except for forming an electron auxiliary layer by using the solution for an electron auxiliary layer according to Preparation Example 7 instead of the solution for an electron auxiliary layer according to Preparation Example 1.

Comparative Example 1

A quantum dot device is manufactured according to the same method as Example 1 except for forming an electron auxiliary layer (HOMO: 7.31 eV, LUMO: 4.05 eV) by using the solution for an electron auxiliary layer according to Comparative Preparation Example 1 instead of the solution for an electron auxiliary layer according to Preparation Example 1.

Evaluation III

Current-voltage-luminescence characteristics of the quantum dot devices according to Examples 1 to 4 and Comparative Example 1 are evaluated.

The current-voltage-luminescence characteristics are evaluated by using a Keithley 220 current source and a Minolta CS200 spectroradiometer.

The results are shown in Table 3.

TABLE 3

| | Example 1 | Example 2 | Example 3 | Example 4 | Comparative Example 1 |
|---|---|---|---|---|---|
| $EQE_{max}$ | 4.3 | 3.2 | 2.8 | 7.7 | 2.6 |
| EQE @500 nit | 3.6 | 2.9 | 2.8 | 6.9 | 2.6 |
| EQE @1000 nit | 4.3 | 2.9 | 2.8 | 4.3 | 2.5 |
| $Cd/A_{max}$ | 2.5 | 2.5 | 1.8 | 5.2 | 1.5 |
| V @ 5 mA | 3.0 | 3.2 | 3.1 | 4.0 | 3.1 |
| $Lum_{max}$ | 4960 | 4580 | 3950 | 3860 | 3280 |
| $\lambda_{max}$ | 454 | 458 | 458 | 455 | 454 |
| Full width at half maximum (FWHM) (nm) | 27 | 32 | 31 | 27 | 26 |

$EQE_{max}$: maximum external quantum efficiency
EQE@500 nit: external quantum efficiency at 500 nit (candelas per square meter
EQE©1000 nit: external quantum efficiency at 1000 nit
$Cd/A_{max}$: maximum current efficiency
$Lum_{max}$: maximum luminance Referring to Table 3, the quantum dot devices according to Examples show improved efficiency and luminance compared with the quantum dot device according to Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising
a first electrode and a second electrode facing each other,
a quantum dot layer disposed between the first electrode and the second electrode, and
an electron auxiliary layer disposed between the quantum dot layer and the second electrode,
wherein the electron auxiliary layer comprises an electron-transporting material represented by a chemical formula 1 and an electron-controlling material capable of decreasing electron mobility of the electron auxiliary layer:
the chemical formula 1

$Zn_{1-x}M_xO$ 

wherein, in the chemical formula 1,
M is a metal except Zn, and
0<x<0.5, and
wherein the electron-controlling material comprises an acetate, an acrylate, a propionate, a carboxylate, a cyano compound, an amide, a nitride, a nitrate, a halide compound, a sulfonyl compound, or a combination thereof.

2. The quantum dot device of claim 1, wherein a difference between lowest unoccupied molecular orbital energy levels of the electron auxiliary layer and the quantum dot layer is greater than a difference between lowest unoccupied molecular orbital energy levels of ZnO and the quantum dot layer.

3. The quantum dot device of claim 2, wherein a difference between lowest unoccupied molecular orbital energy levels of the electron auxiliary layer and the quantum dot layer is 0.2 electronvolts to 1.2 electronvolts greater than a difference between lowest unoccupied molecular orbital energy levels of ZnO and the quantum dot layer.

4. The quantum dot device of claim 1, wherein a difference between lowest unoccupied molecular orbital energy levels of the electron auxiliary layer and the quantum dot layer ranges from 1.2 electronvolts to 2.0 electronvolts.

5. The quantum dot device of claim 4, wherein
a lowest unoccupied molecular orbital energy level of the quantum dot layer ranges from 2.5 electronvolts to 3.6 electronvolts, and
a lowest unoccupied molecular orbital energy level of the electron auxiliary layer ranges from 3.7 electronvolts to 5.3 electronvolts.

6. The quantum dot device of claim 1, wherein M comprises Mg, Co, Ni, Zr, Mn, Sn, Y, Ga, Al, or a combination thereof.

7. The quantum dot device of claim 1, wherein the electron-controlling material comprises an acetate.

8. The quantum dot device of claim 1, wherein the electron-controlling material is present in an amount of 3 weight percent to 50 weight percent, based on a total amount of the electron-transporting material and the electron-controlling material.

9. The quantum dot device of claim 1, wherein x of the chemical formula 1 satisfies the range, 0.05≤x≤0.3, and
the electron-controlling material is present in an amount of 10 weight percent to 30 weight percent, based on a total amount of the electron-transporting material and the electron-controlling material.

10. The quantum dot device of claim 1, wherein the electron-transporting material and the electron-controlling material are mixed.

11. The quantum dot device of claim 1, wherein
the electron auxiliary layer comprises
a first electron auxiliary layer adjacent to the quantum dot layer, and
a second electron auxiliary layer adjacent to the second electrode
wherein one of the first electron auxiliary layer and the second electron auxiliary layer comprises the electron-transporting material, and
the other of the first electron auxiliary layer and the second electron auxiliary layer comprises the electron-controlling material.

12. The quantum dot device of claim 1, wherein an energy bandgap of the quantum dot layer ranges from 2.4 electronvolts to 2.9 electronvolts.

13. The quantum dot device of claim 1, wherein the quantum dot layer comprises a non-cadmium quantum dot.

14. The quantum dot device of claim 1, wherein the quantum dot layer comprises a blue light emitting quantum dot having a peak emission wavelength of less than or equal to 470 nanometers.

15. The quantum dot device of claim 14, wherein the quantum dot comprises
zinc and tellurium, selenium, or a combination thereof, or
indium and zinc, phosphorus, or a combination thereof.

16. The quantum dot device of claim 15, wherein the quantum dot comprises
a core comprising
zinc and tellurium, selenium, or a combination thereof, or
indium and zinc, phosphorus, or a combination thereof and
a shell disposed on at least one part of the core and having a different composition from the core.

17. The quantum dot device of claim 16, wherein the shell comprises ZnSeS, ZnS, or a combination thereof.

18. The quantum dot device of claim 1, wherein the first electrode is an anode and the second electrode is a cathode.

19. A display device comprising the quantum dot device of claim 1.

20. The quantum dot device of claim 9, wherein M comprises Mg.

21. A quantum dot device, comprising
a first electrode and a second electrode facing each other,
a quantum dot layer disposed between the first electrode and the second electrode, and
an electron auxiliary layer disposed between the quantum dot layer and the second electrode,
wherein the electron auxiliary layer comprises an electron-transporting material represented by a chemical formula 1, an electron-controlling material capable of decreasing electron mobility of the electron auxiliary layer, and Zn salt, M salt, or the combination thereof, and
wherein the electron-controlling material comprises an organic material, an inorganic material, an organic/inorganic material that has electron withdrawing characteristics, or a combination thereof:

the chemical formula 1

$$Zn_{1-x}M_xO$$

wherein, in the chemical formula 1,
M is a metal except Zn, and
$0<x<0.5$.

* * * * *